(12) United States Patent
Poplevine et al.

(10) Patent No.: US 6,184,557 B1
(45) Date of Patent: Feb. 6, 2001

(54) I/O CIRCUIT THAT UTILIZES A PAIR OF WELL STRUCTURES AS RESISTORS TO DELAY AN ESD EVENT AND AS DIODES FOR ESD PROTECTION

(75) Inventors: Pavel Poplevine, Foster City; Alexander Kalnitsky, San Francisco; Hengyang (James) Lin, San Jose; Albert Bergemont, Palo Alto, all of CA (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/239,344

(22) Filed: Jan. 28, 1999

(51) Int. Cl.[7] .................................................. H01L 23/62
(52) U.S. Cl. .......................... 257/358; 257/357; 257/363; 438/199; 438/210
(58) Field of Search ..................... 257/355, 356, 257/357, 358, 360, 363; 438/199, 210, 238

(56) References Cited

U.S. PATENT DOCUMENTS

| | | | |
|---|---|---|---|
| 3,712,995 | * 1/1973 | Steudel | 207/202 |
| 3,967,295 | * 6/1976 | Stewart | 357/51 |
| 4,264,941 | * 4/1981 | London | 361/91 |
| 5,121,179 | * 6/1992 | Sasaki | 357/23.13 |
| 5,576,557 | * 11/1996 | Ker et al. | 257/173 |
| 5,637,900 | * 6/1997 | Ker et al. | 257/355 |

* cited by examiner

Primary Examiner—Sara Crane
(74) Attorney, Agent, or Firm—Limbach & Limbach L.L.P.

(57) ABSTRACT

The n-channel and p-channel driver transistors of an I/O circuit are electrostatic discharge (ESD) protected by utilizing a pair of well structures that resistively delay an ESD event from reaching the driver transistors, and that form diodes that direct the ESD event to the supply rail or ground of the circuit.

14 Claims, 10 Drawing Sheets

I/O CIRCUIT THAT UTILIZES A PAIR OF WELL STRUCTURES AS RESISTORS TO DELAY AN ESD EVENT AND AS DIODES FOR ESD PROTECTION

BACKGROUND OF THE INVENTION

1. Field of the Invention

The present invention relates to input/output (I/O) circuits and, more particularly, to an I/O circuit that utilizes a pair of well structures as resistors to delay an ESD event, and as diodes for electrostatic discharge (ESD) protection.

2. Description of the Related Art

In recent years, increasing attention has been devoted to protecting packaged integrated circuits from damage that results from an electrostatic discharge (ESD) event. This has become more important as the gate oxide thicknesses of MOS transistors have become thinner due to the improved processing technologies that are now commonly in use.

An ESD event typically occurs when the packaged chip is exposed to static electricity, such as when the pins are touched by an ungrounded person handling the chip prior to installation, or when the chip slides across another surface on its pins.

Figure 1:
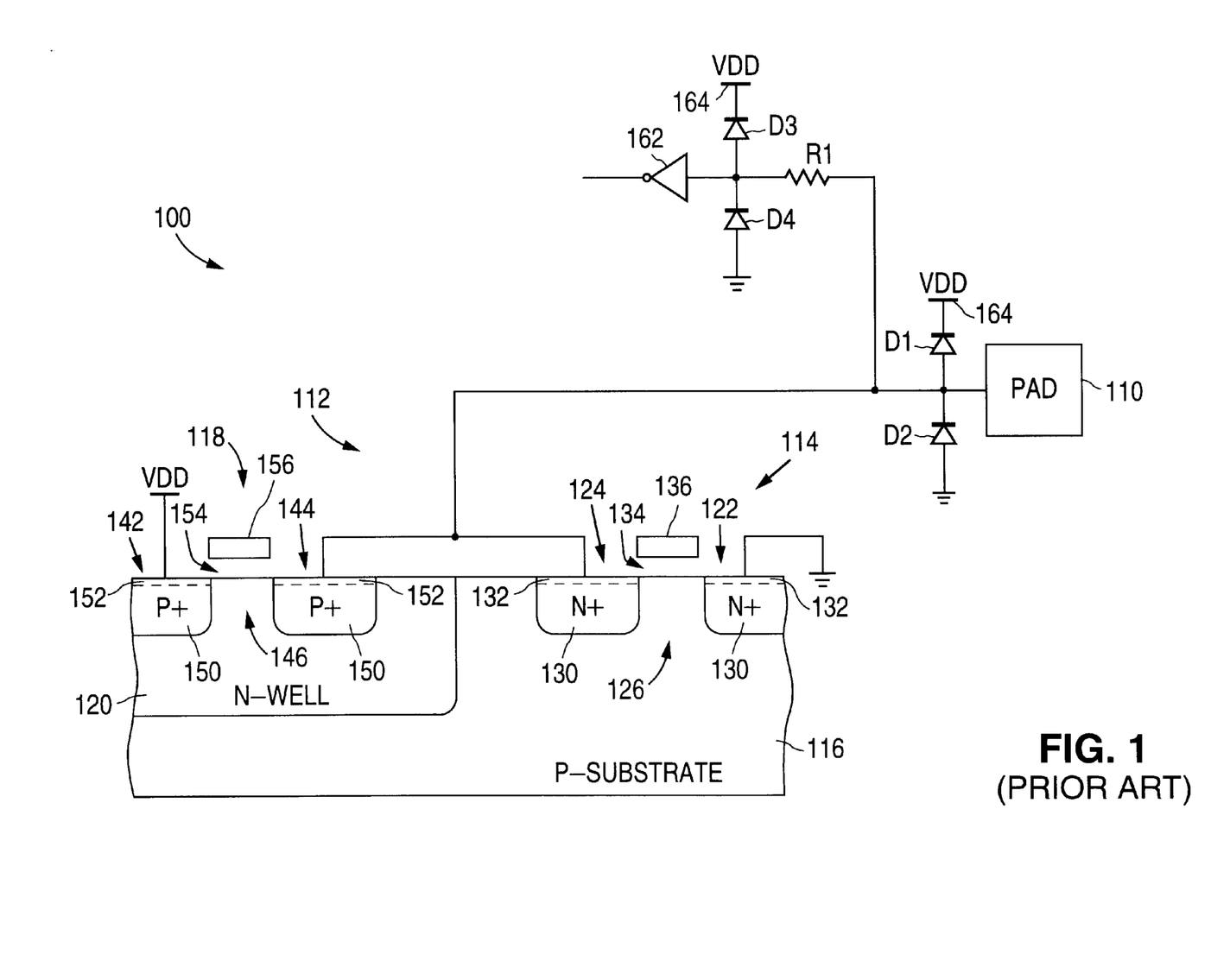
FIG. 1 is a schematic and cross-sectional drawing illustrating a conventional input/output (I/O) circuit 100.

FIG. 1 shows a schematic and cross-sectional drawing that illustrates a conventional input/output (I/O) circuit 100. As shown in FIG. 1, circuit 100 includes an I/O pad 110 which is connected to an I/O pin (not shown), and a driver circuit 112 which is connected to pad 110.

As further shown in FIG. 1, driver circuit 112 includes a n-channel transistor 114 which is formed in a p– substrate 116, and a p-channel transistor 118 which is formed in a n– well 120 which, in turn, is formed in substrate 116.

N-channel transistor 114 has spaced-apart source and drain regions 122 and 124 which are formed in substrate 116, and a channel region 126 which is defined between source and drain regions 122 and 124. Source and drain regions 122 and 124 each include a n+diffusion region 130 and a layer of silicide 132 which is formed over diffusion region 130.

In addition to the above, transistor 114 also has a layer of gate oxide 134 which is formed over channel region 126, and a gate 136 which is formed on gate oxide layer 134 over channel region 126.

Similarly, p-channel transistor 118 has spaced-apart source and drain regions 142 and 144 which are formed in well 120, and a channel region 146 which is defined between source and drain regions 142 and 144. Source and drain regions 142 and 144 each include a p+diffusion region 150 and a layer of silicide 152 which is formed over diffusion region 150.

As with transistor 114, transistor 118 also has a layer of gate oxide 154 which is formed over channel region 146, and a gate 156 which is formed on gate oxide layer 154 over channel region 146.

As additionally shown in FIG. 1, I/O circuit 100 further includes a first pair of electrostatic discharge (ESD) protection diodes D1 and D2, and a resistor R1 which are each connected to pad 110. Diode D1 has an input connected to pad 110, and an output connected to a supply rail 164, while diode D2 has an input connected to ground and an output connected to pad 110.

Further, circuit 100 also includes a second pair of ESD protection diodes D3 and D4, and an internal circuit 162 which are each connected to resistor R1. Diode D3 has an input connected to resistor R1 and internal circuit 162, and an output connected to supply rail 164. Diode D4 has an input connected to ground, and an output connected to resistor R1 and internal circuit 162.

In operation, when the voltage on pad 110 rises above a supply voltage VDD on supply rail 164 due to an ESD event, ESD protection diodes D1 and D3 become forward biased and turn on to "sink" the ESD voltage on pad 110 to supply rail 164. Similarly, when an ESD voltage on pad 110 falls below ground, diodes D2 and D4 become forward biased and turn on to "short"pad 110 to ground.

One drawback of I/O circuit 100 is that since drain regions 124 and 144 of transistors 114 and 118 are connected to I/O pad 110, the large positive and negative ESD voltages that appear on pad 110 also appear on drain regions 124 and 144. These large ESD voltages on drain regions 124 and 144, however, can break down gate oxide layers 134 and 154 before diodes D1–D4 have had a chance to fully dissipate the event.

This breakdown, which is only exacerbated by the presence of highly conductive silicide layers 132 and 152 (which are both typically formed during the same processing step), damages or destroys the driver transistors.

One approach for reducing the voltage that appears on drain regions 124 and 144 during an ESD event is to resistively delay the ESD voltage from reaching drain regions 124 and 144, thereby providing diodes D1–D4 with additional time to dissipate the event.

Figure 2:
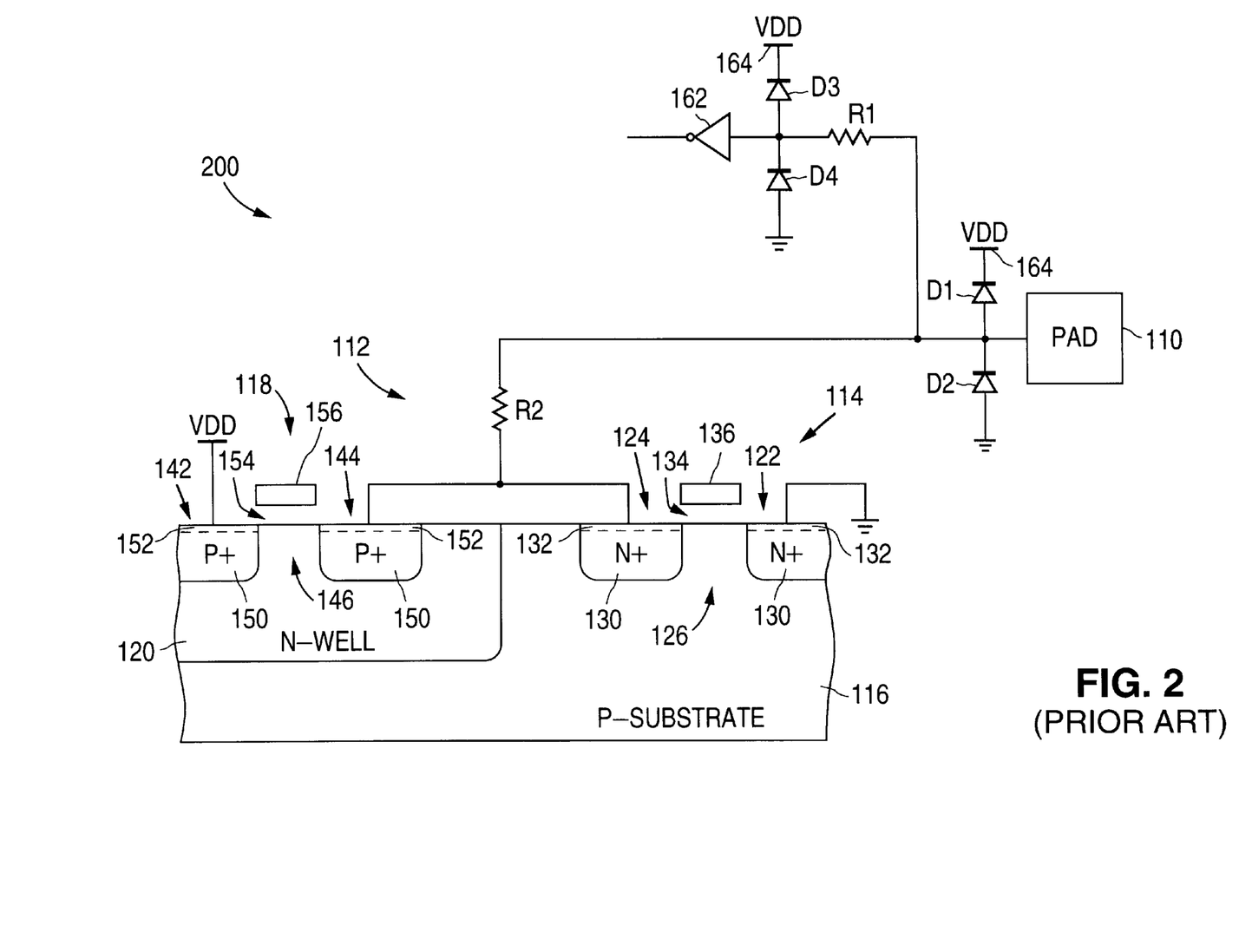
FIG. 2 is a schematic and cross-sectional drawing illustrating a first-type of a conventional resistively-delayed input/output (I/O) circuit 200.

FIG. 2 shows a schematic and cross-sectional drawing that illustrates a first-type of a conventional resistively-delayed input/output (I/O) circuit 200. Circuit 200 is similar to circuit 100 and, as a result, utilizes the same reference numerals to represents the structures which are common to both circuits.

As shown in FIG. 2, circuit 200 differs from circuit 100 in that circuit 200 includes a thin-film resistor R2 which is connected between pad 110 and drains 124 and 144. Although resistor R2 resistively delays an ESD event from reaching drain regions 124 and 144, thin-film resistors occupy a significant amount of silicon real estate and require additional fabrication steps.

Figure 3:
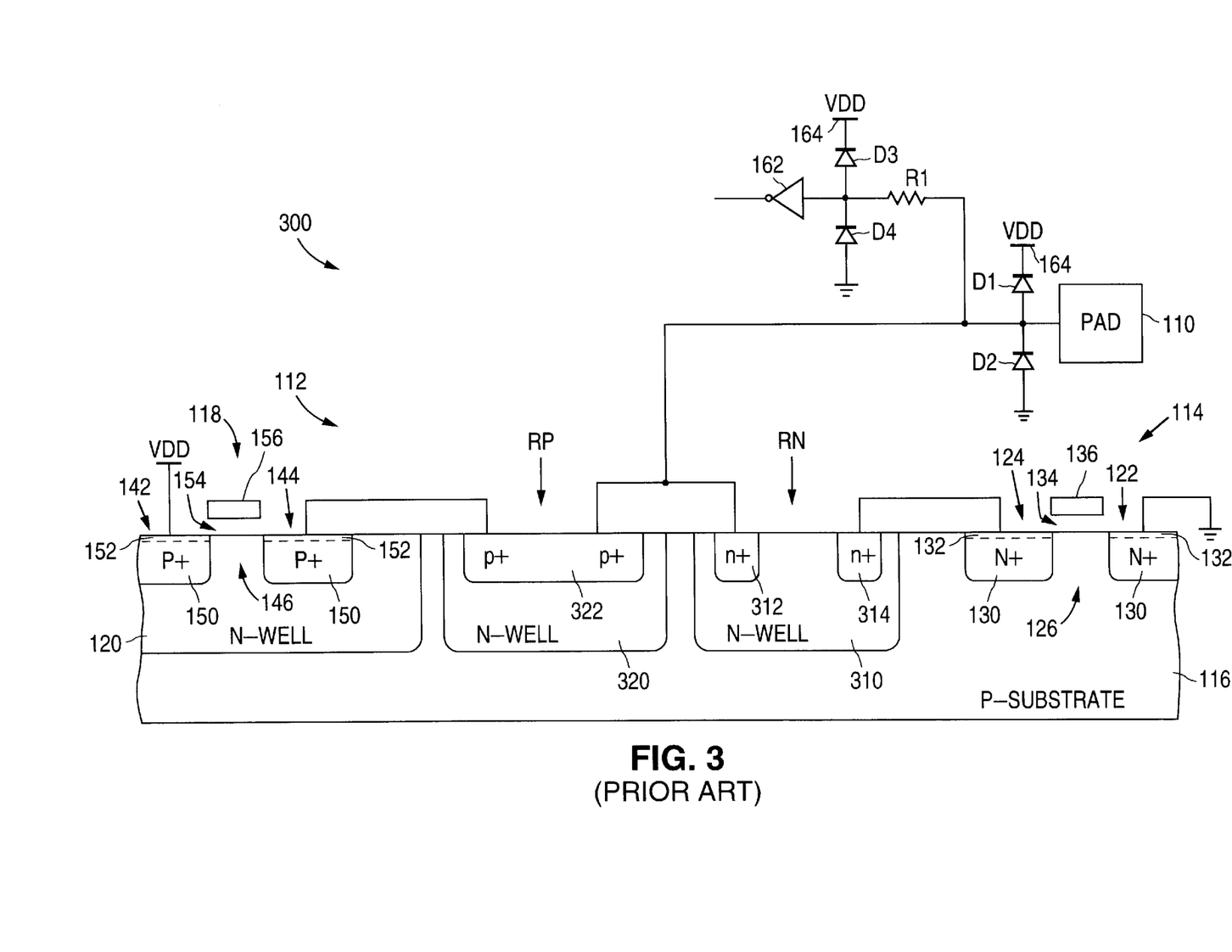
FIG. 3 is a schematic and cross-sectional drawing illustrating a second-type of a conventional resistively-delayed input/output (I/O) circuit 300.

Rather than using thin-film resistors, diffused substrate regions may also be used as resistors. FIG. 3 shows a schematic and cross-sectional drawing that illustrates a second-type of a conventional resistively-delayed input/output (I/O) circuit 300. Circuit 300 is similar to circuit 100 and, as a result, utilizes the same reference numerals to represents the structures which are common to both circuits.

As shown in FIG. 3, circuit 300 differs from circuit 100 in that circuit 300 includes a pair of diffused substrate regions RN and RP. Region RN includes a n– well 310 which is formed in p-substrate 116, and a pair of spaced-apart n+ contacts 312 and 314 which are formed in n– well 310. Contact 312 is connected to pad 110, while contact 314 is connected to drain region 124.

Region RP includes an n– well 320 which is formed in p–substrate 116, and a p+ region 322 which is formed in the surface of n– well 320. P+ region 322 is relatively shallow as p+ region 322 is formed during the same step that forms the source and drain regions of p-channel transistor 118 and the p-channel CMOS transistors of the internal circuitry. As shown, one end of p+ region 322 is connected to pad 110, while the other end of p+ region 322 is connected to drain region 144.

In operation, regions RN and RP resistively delay an ESD event from reaching drain regions 124 and 144, thereby providing diodes D1–D4 additional time to dissipate the ESD event.

One problem with circuit 300, however, is that it is difficult, if not impossible, to obtain a symmetric output from driver transistors 114 and 118. N− well 310 has a sheet resistance of approximately 1.0–1.5 KΩ/square, while p+ region 322 of n− well 320 has a sheet resistance of approximately 40–150Ω/square.

Thus, to balance the resistances provided by regions RN and RP, p+ region 322 and, therefore, n− well 320, must be approximately 10× longer than n− well 310. Being 10× longer, however, substantially increases the capacitance of p+ region 322 which, in turn, prevents driver transistors 114 and 118 from having symmetric outputs.

Thus, there is a need for an I/O circuit that can resistively delay an ESD event from reaching the drain regions of the driver transistors, and provide more symmetric outputs.

SUMMARY OF THE INVENTION

Conventionally, when a pair of diffused substrate regions with opposing conductivity types are utilized to resistively delay an electrostatic discharge (ESD) event from reaching the driver transistors of an input/output (I/O) circuit, the capacitances of the diffused substrate regions are difficult to match once the resistances have been matched. Unmatched capacitances, in turn, prevent the driver transistors from having symmetric outputs.

In the present invention, more symmetric outputs are obtained from the driver transistors by utilizing a pair of well structures, which have more balanced capacitances when the resistances are balanced, to resistively delay an electrostatic discharge (ESD) event from reaching the driver transistors. In addition, the well structures also provide ESD diode protection, thereby reducing the amount of silicon real estate that is consumed by ESD diodes.

In accordance with the present invention, an I/O circuit, which is formed in a semiconductor material of a first conductivity type, includes a first well of a second conductivity type which is formed in the semiconductor material, and a second well of the first conductivity type which is formed in the first well.

The I/O circuit of the present invention also includes a pair of spaced-apart first contacts of the first conductivity type that are formed in the second well. The first contacts have a dopant concentration that is greater than the dopant concentration of the second well.

The I/O circuit of the present invention further includes a third well of the second conductivity type which is formed in the semiconductor material, and a pair of spaced-apart second contacts of the second conductivity type which are formed in the third well. The second contacts have dopant concentrations that are greater than the dopant concentration of the third well.

The I/O circuit of the present invention additionally includes an I/O pad which is connected to a first contact of the first contacts in the second well, and a first contact of the second contacts in the third well. Further, a first driver transistor is connected to a second contact of the first contacts in the second well.

The I/O circuit of the present invention also includes a second driver transistor which is connected to a second contact of the second contacts in the third well, and an internal circuit which is connected to the second contact of the first contacts, and the second contact of the second contacts.

A better understanding of the features and advantages of the present invention will be obtained by reference to the following detailed description and accompanying drawings which set forth an illustrative embodiment in which the principals of the invention are utilized.

DESCRIPTION OF THE PRESENT INVENTION

Figure 4:
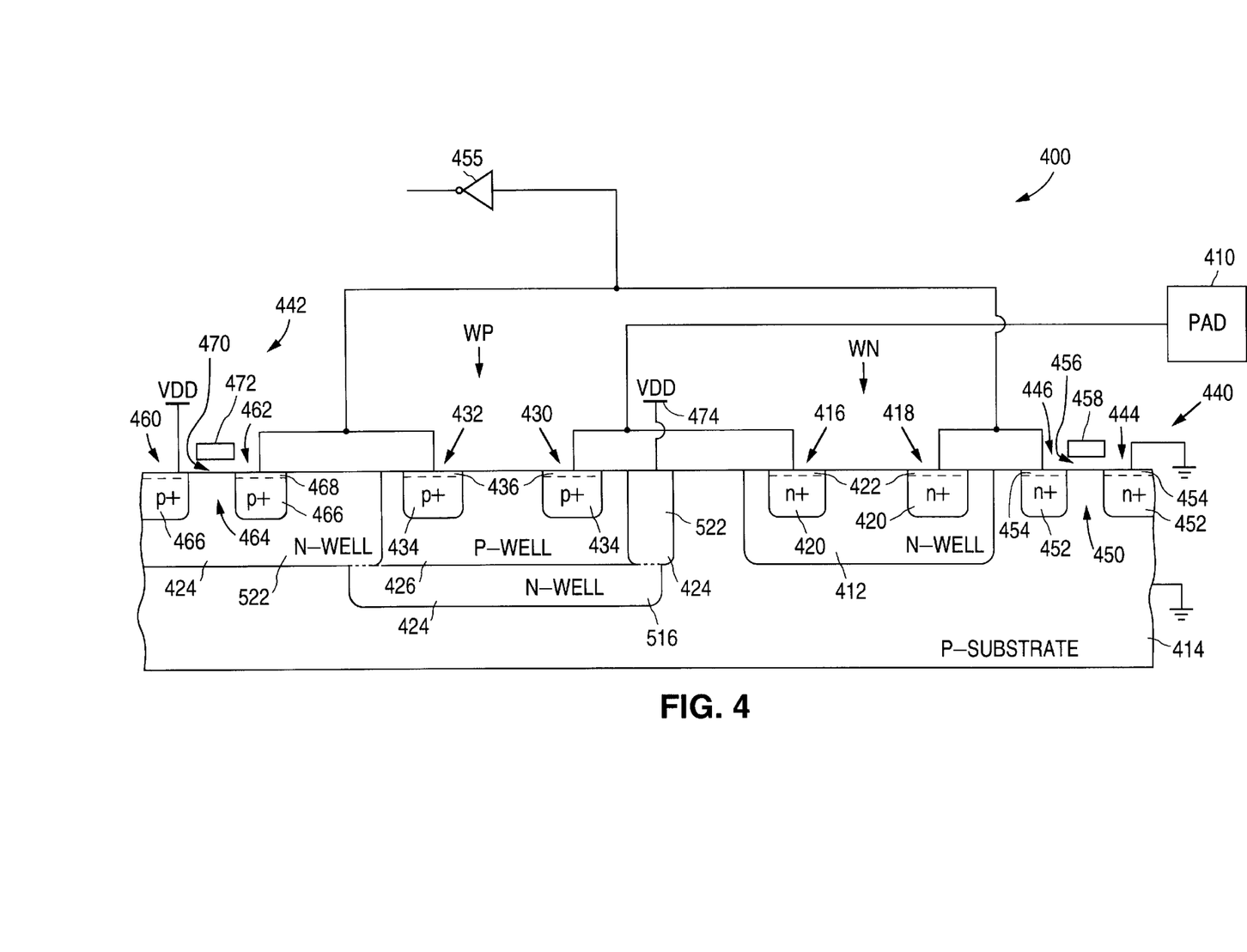
FIG. 4 is a schematic and cross-sectional drawing illustrating an input/output (I/O) circuit 400 in accordance with the present invention.

FIG. 4 shows a schematic and cross-sectional drawing that illustrates an input/output (I/O) circuit 400 in accordance with the present invention. As described in greater detail below, the present invention utilizes a pair of well structures as resistors to delay an ESD event, and as diodes for electrostatic discharge (ESD) protection.

As shown in FIG. 4, circuit 400 includes an I/O pad 410 which is connected to an I/O pin (not shown), and a pair of well structures WN and WP which are connected to I/O pad 410. Well structure WN includes a n− well 412 which is formed in a p− semiconductor material 414, such as a substrate, and a pair of spaced-apart n+ contacts 416 and 418 which are formed in n− well 412.

Contact 416, which is connected to pad 110, and contact 418, each include a n+ diffusion region 420 and a layer of silicide 422 which is formed over diffusion region 420. (Contacts 416 and 418 may optionally be formed without silicide layer 422.)

Well structure WP includes a n− well 424 which is formed in material 414, and a p− well 426 which is formed in n− well 424 so that p− well 426 is isolated from material 414 by n− well 424. (By isolating p− well 426, the threshold voltages of any NMOS transistors which might be formed in p− well 426 are shifted. As a result, NMOS transistors formed in p− well 426 have threshold voltages which are approximately 10–15 mV less than the threshold voltages of NMOS transistors formed in a standard p− well).

In addition, well structure WP also includes a pair of spaced-apart p+ contacts 430 and 432 which are formed in p− well 426. Contact 430, which is connected to pad 410, and contact 432, each include a n+ diffusion region 434 and a layer of silicide 436 which is formed over diffusion region 434. (Contacts 430 and 432 may optionally be formed without silicide layer 436.)

As further shown in FIG. 4, circuit 400 also includes a n-channel driver transistor 440 which is formed in p– semiconductor material 414, and a p-channel driver transistor 442 which is formed in n– well 424. N-channel transistor 440 has spaced-apart source and drain regions 444 and 446 which are formed in material 414, and a channel region 450 which is defined between source and drain regions 444 and 446.

Source and drain regions 444 and 446, in turn, each include a n+ diffusion region 452 and a layer of silicide 454 which is formed over diffusion region 452. (Transistor 440 may optionally be formed without silicide layer 454.) Further, drain region 446 is connected to contact 418 and to an internal circuit 455.

In addition to the above, transistor 440 also has a layer of gate oxide 456 which is formed over channel region 450, and a gate 458 which is formed on gate oxide layer 456 over channel region 450.

Similarly, p-channel transistor 442 has spaced-apart source and drain regions 460 and 462 which are formed in well 424, and a channel region 464 which is defined between source and drain regions 460 and 462. Source and drain regions 460 and 462, in turn, each include a p+ diffusion region 466 and a layer of silicide 468 which is formed over diffusion region 466. (Transistor 442 may optionally be formed without silicide layer 468.) Further, drain region 462 is connected to contact 432 and to internal circuit 455.

As with transistor 440, transistor 442 also has a layer of gate oxide 470 which is formed over channel region 464, and a gate 472 which is formed on gate oxide layer 470 over channel region 464.

In operation, when the voltage on pad 410 rises above a positive supply voltage VCC on a supply rail 474, or falls below ground, due to an ESD event, well structures WN and WP resistively delay the voltage from reaching drain regions 446 and 462.

In addition, p– well 426, along with the other p– wells used by the internal circuitry, have a sheet resistance of approximately _?_ $\Omega$/square. As a result, when n– well 412 and p– well 426 are sized to have the same resistance, p– well 426 is only slightly longer than n– well 424. As a result, the capacitances of n– well 412 and p– well 426 are more balanced which, in turn, leads to a more symmetric output signal.

Further, during operation, ground is applied to material 414, while positive supply voltage VCC is applied to n– well 424 via supply rail 474. Thus, when the voltage on pad 410 rises above the positive supply voltage VCC on supply rail 474 due to an ESD event, the junction between p– well 426 and n– well 424 becomes forward biased and turns on to "sink" the ESD voltage on pad 410 to supply rail 474.

Similarly, when the voltage on pad 410 falls below ground due to an ESD event, the junction between n– well 412 and p– material 414 becomes forward biased and turns on to "short" pad 410 to ground.

Thus, in accordance with the present invention, in addition to providing a more balanced resistive delay, well structures WN and WP also provide circuit 400 with ESD protection without using stand-alone diodes, such as diodes D1–D4 of circuit 300. This, in turn, reduces the amount of silicon real estate that is consumed by ESD diodes.

In the present invention, the delays provided by well structures WN and WP are sufficient to allow well structures WN and WP to fully dissipate voltages from ESD events which would have damaged or destroyed the driver transistors of circuit 100.

In addition, the resistive delays and the amount of ESD protection both increase as the lengths of wells 412 and 426 increase as longer wells increase the delay and the surface area of the junction diode.

Figure 5A:
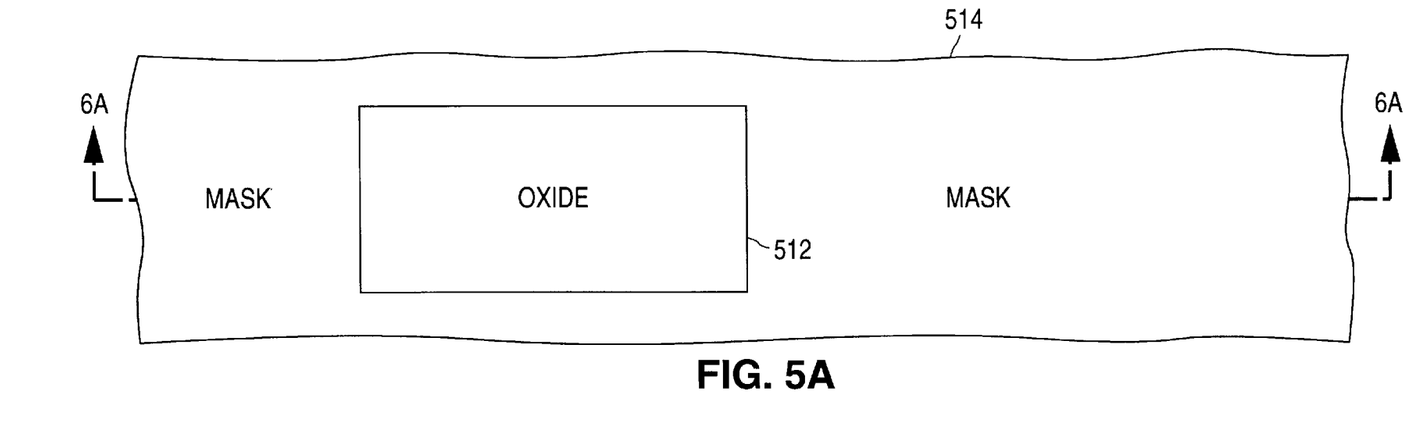
FIGS. 5A–5C are a series of plan views illustrating a method for forming circuit 400 in accordance with the present invention.
Figure 5B:
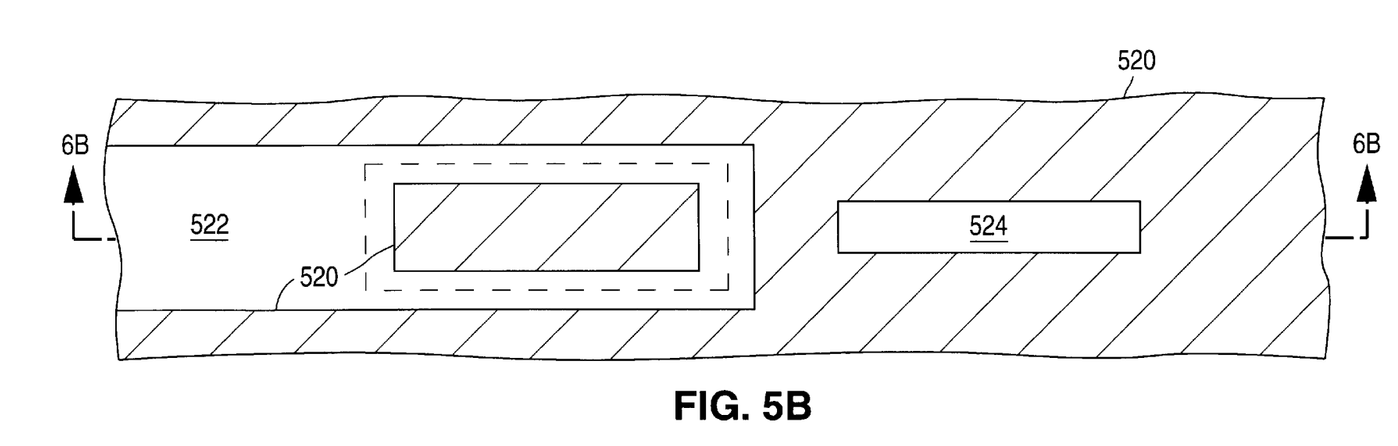
Figure 5C:
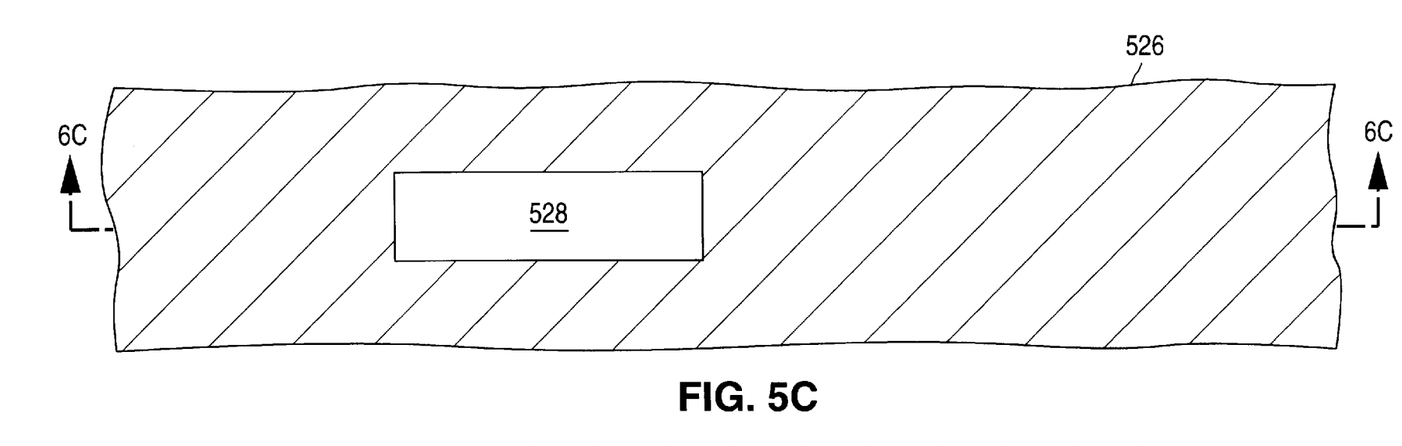
Figure 6A:
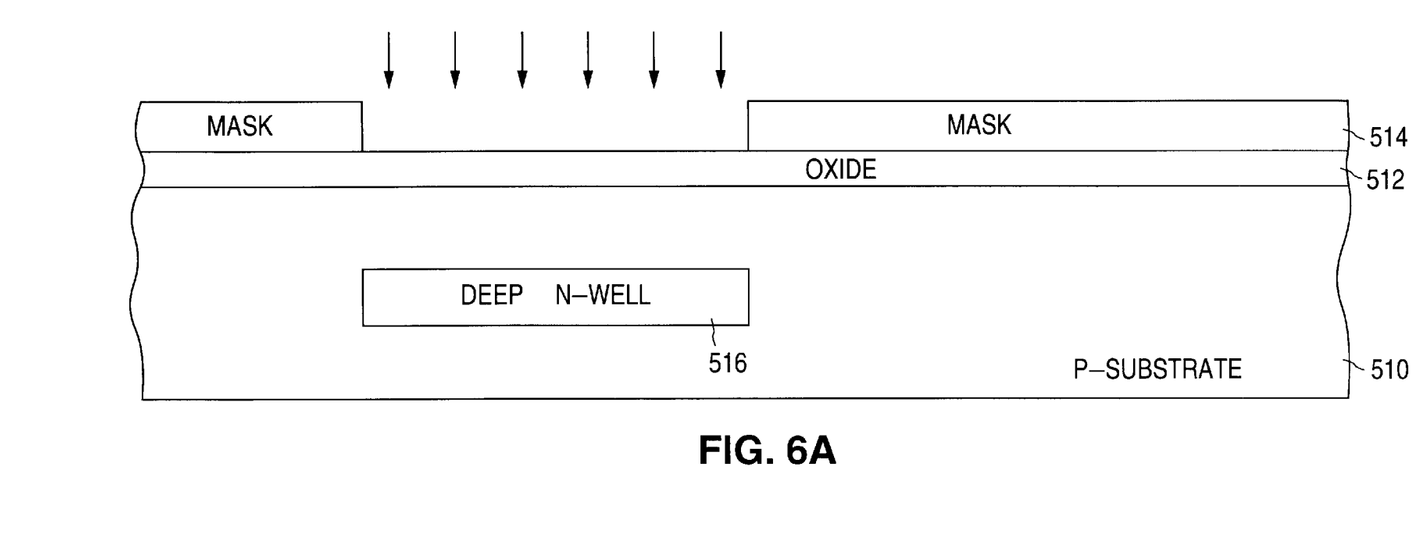
FIGS. 6A–6C are a series of cross-sectional views taken along lines 6A—6A through 6C—6C of FIGS. 5A–5C, respectively.
Figure 6B:
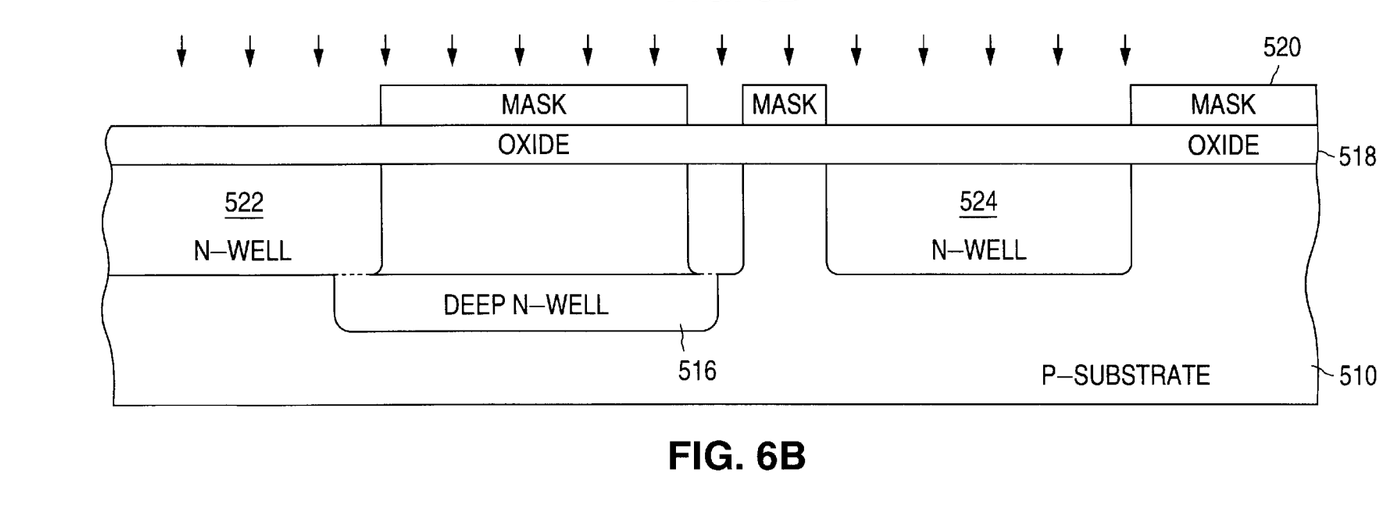
Figure 6C:
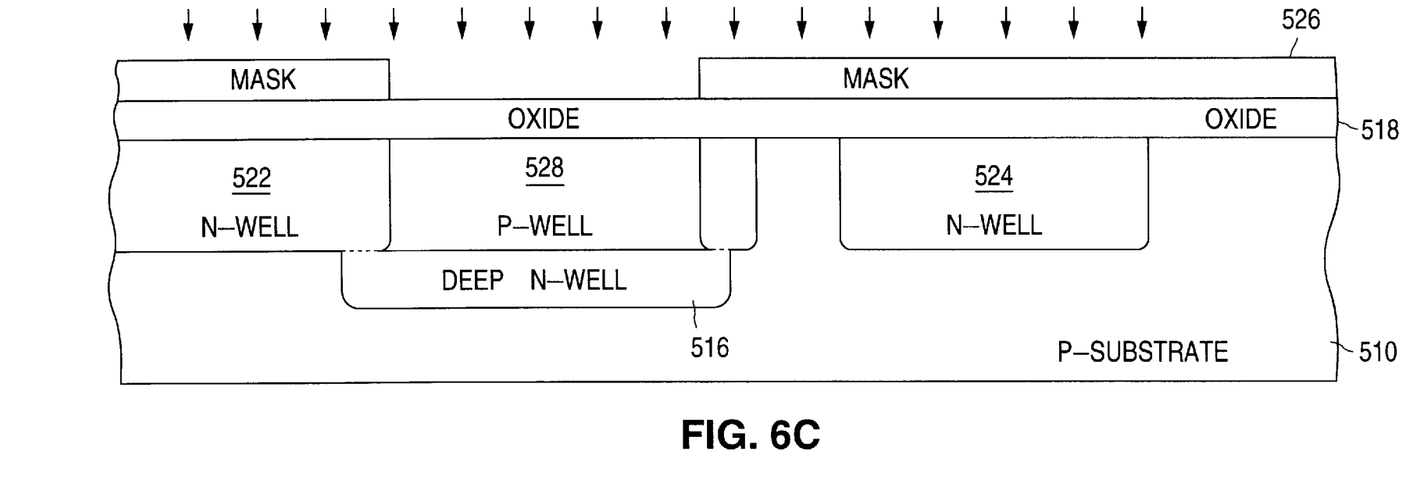

FIGS. 5A–5C show a series of plan views that illustrate a method for forming circuit 400 in accordance with the present invention. FIGS. 6A–6C show a series of cross-sectional views taken along lines 6A—6A through 6C—6C of FIGS. 5A–5C, respectively.

As shown in FIGS. 5A and 6A, the method begins with a conventionally formed p– wafer 510. After this, a layer of sacrificial oxide 512 is formed over wafer 510, followed by the formation and patterning of a buried well mask 514.

After buried well mask 514 has been formed, a n– type dopant, such as phosphorous or arsenic, is implanted into p– wafer 510 at a high energy, e.g., 500 KeV, and a low dose, e.g., $2.5 \times 10^{12}$ atoms/cm$^2$ to form a buried n– well 516. In a deep submicron process, buried well 516 is formed to be approximately 1.5 to 2.0 microns wide. N– well 516 must be wide enough to allow a relatively wide p– well to be formed inside of n– well 516, while insuring that a subsequently formed n– well can contact n– well 516.

After this, mask 514 is removed. Next, wafer 510 is placed in an oxidizing ambient of, for example, 5% $O_2$ in $N_2$ and driven in for several hours at a temperature above 1100° C. Following this, the process follows conventional twin-well CMOS fabrication steps.

As shown in FIGS. 5B and 6B, these conventional steps include the step of forming a n– well mask 520 on a sacrificial layer of oxide 518 which, in turn, is formed on wafer 510. After mask 520 has been formed, the unmasked areas are implanted with an n– type dopant to form a n– well 522 which contacts buried n– well 516, and a n– well 524. In a deep submicron process, n– well 522 and n– well 524 are formed to have depths of approximately one micron. Mask 520 is then removed.

As shown in FIGS. 5C and 6C, after mask 520 has been removed, a p– well mask 526 is formed and patterned on oxide layer 518. Next, a p-type dopant is implanted to form a p– well 528 which also has a depth of approximately one micron. (N– well 524 and p– well 528 are formed to have a large area and a small resistance value to prevent drive transistors 440 and 442 from being excessively loaded.)

Thus, n– well 424 is formed from two n-wells: buried n– well 516 and n– well 522. As a result, circuit 400 can be formed by modifying a conventional CMOS process to allow for the formation of buried n– well 516.

Figure 7:
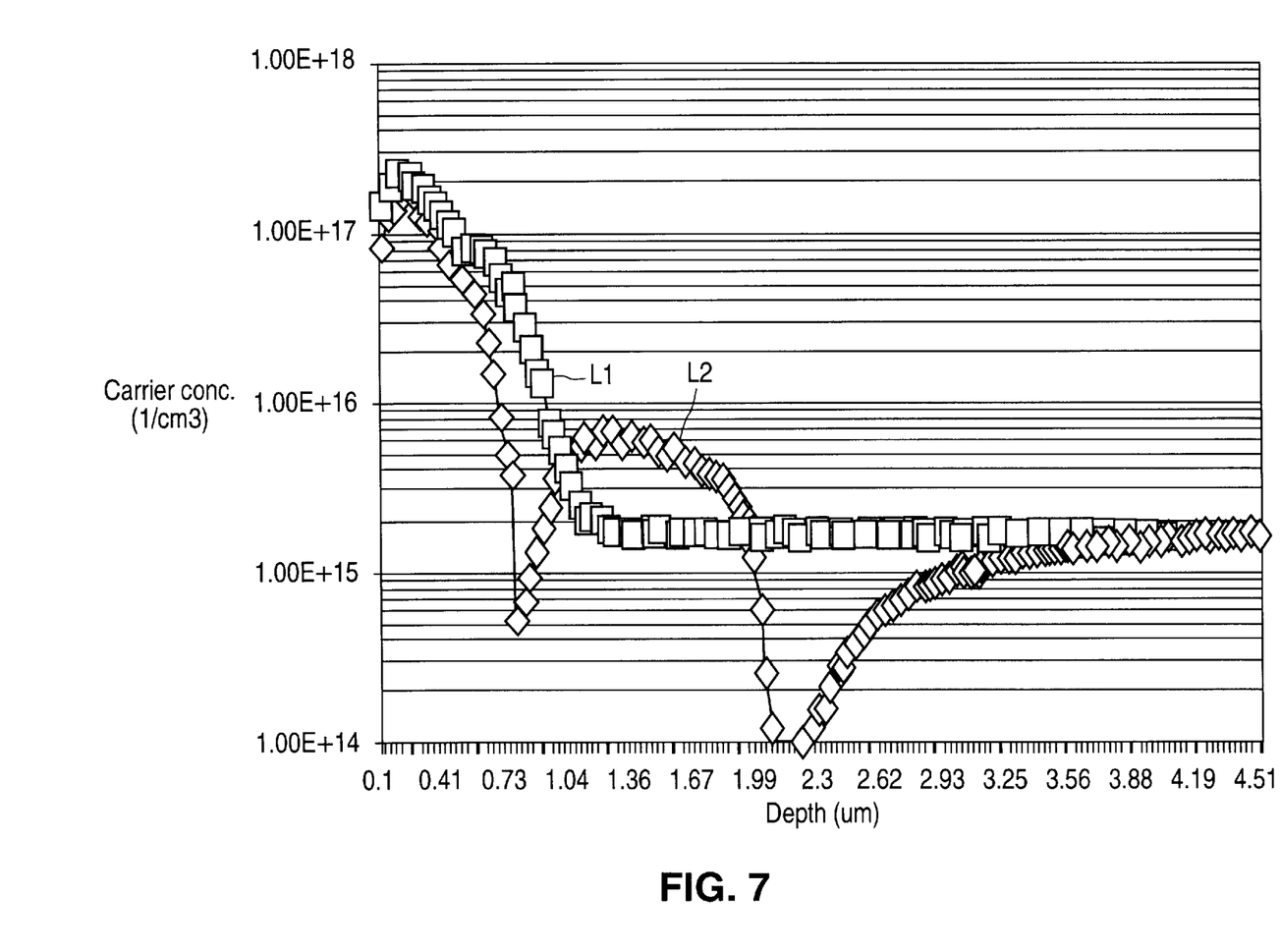
FIG. 7 is a graph illustrating the spreading resistance profiles of a conventional p− well and an isolated p− well such as p− well 426.

FIG. 7 shows a graph that illustrates the spreading resistance profiles of a conventional p– well and an isolated p– well such as p– well 426. As shown with line L1 in FIG. 7, with a standard p– well, the carrier concentration (the density of activated dopants) decreases with depth until the junction between the well and the substrate is reached at approximately 1.04 microns at which point the concentration levels off.

However, with isolated p– well 426, as shown with line L2, the carrier concentration decreases with depth until the junction between p– well 426 and n– well 424/516 is reached at approximately 0.73 microns. The carrier concentration then increases with depth to a peak concentration at approximately 1.04 microns, and then decreases with depth until the junction between n– well 424/516 and p– material 414 is reached at approximately 2.2 microns.

Figure 8:
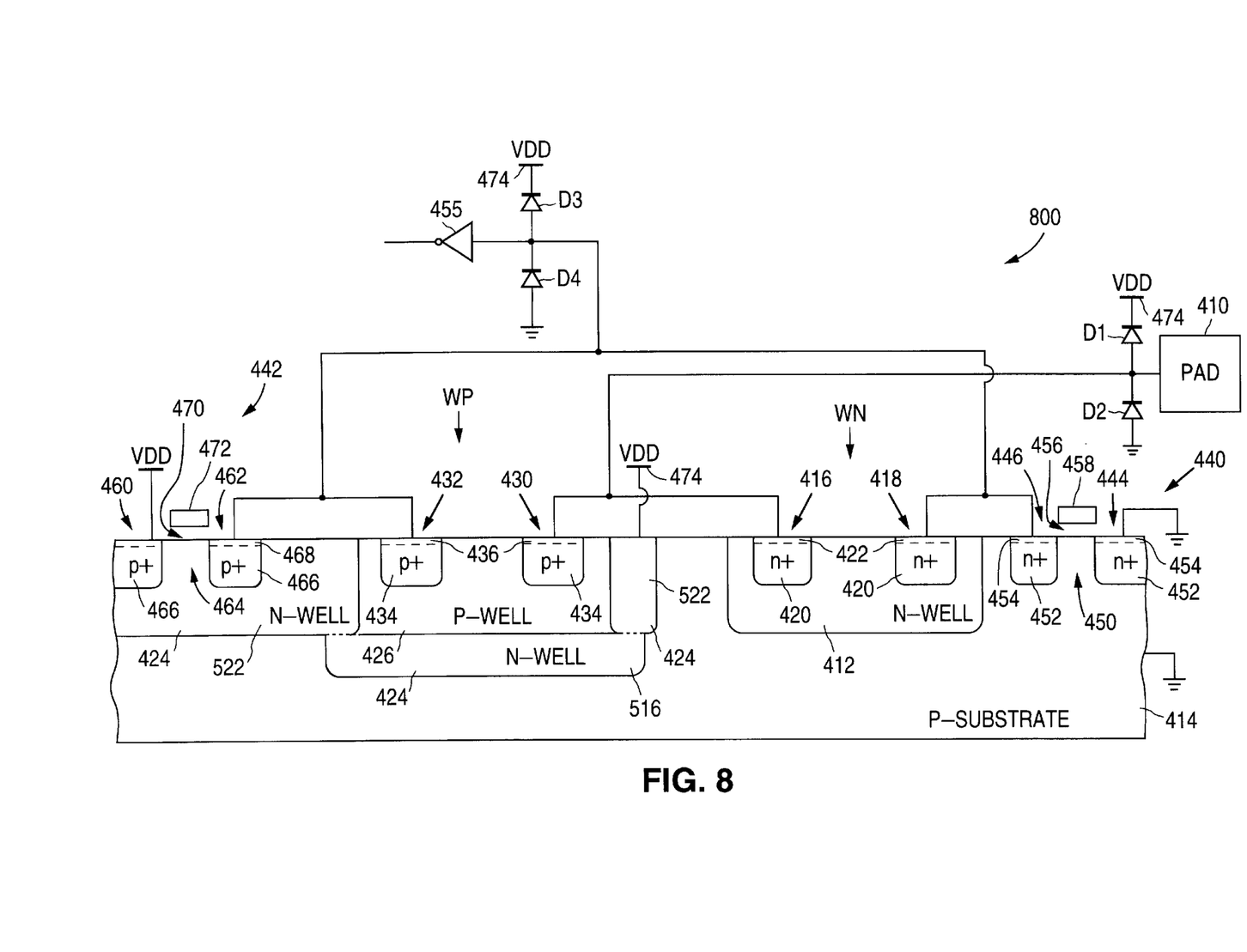
FIG. 8 is a schematic and cross-sectional drawing illustrating an input/output (I/O) circuit 800 in accordance with a first alternate embodiment of the present invention.

For additional ESD protection, additional diodes can be utilized. FIG. 8 shows a schematic and cross-sectional drawing that illustrates an input/output (I/O) circuit 800 in accordance with a first alternate embodiment of the present invention.

Circuit 800 is similar to circuit 400 and, as a result, utilizes the same reference numerals to designate the structures which are common to both circuits. Circuit 800 differs from circuit 400 in that circuit 800 also includes a first pair of ESD protection diodes D1 and D2.

First diode D1 has an input connected to pad 410, and an output connected to supply rail 474, while second diode D2 has an input connected to ground and an output connected to pad 410.

Even further protection can be obtained by using a second pair of ESD protection diodes D3 and D4. Third diode D3 has an input connected to internal circuit 455, and an output connected to supply rail 474, while fourth diode D4 has an input connected to ground, and an output connected to internal circuit 455.

Figure 9:
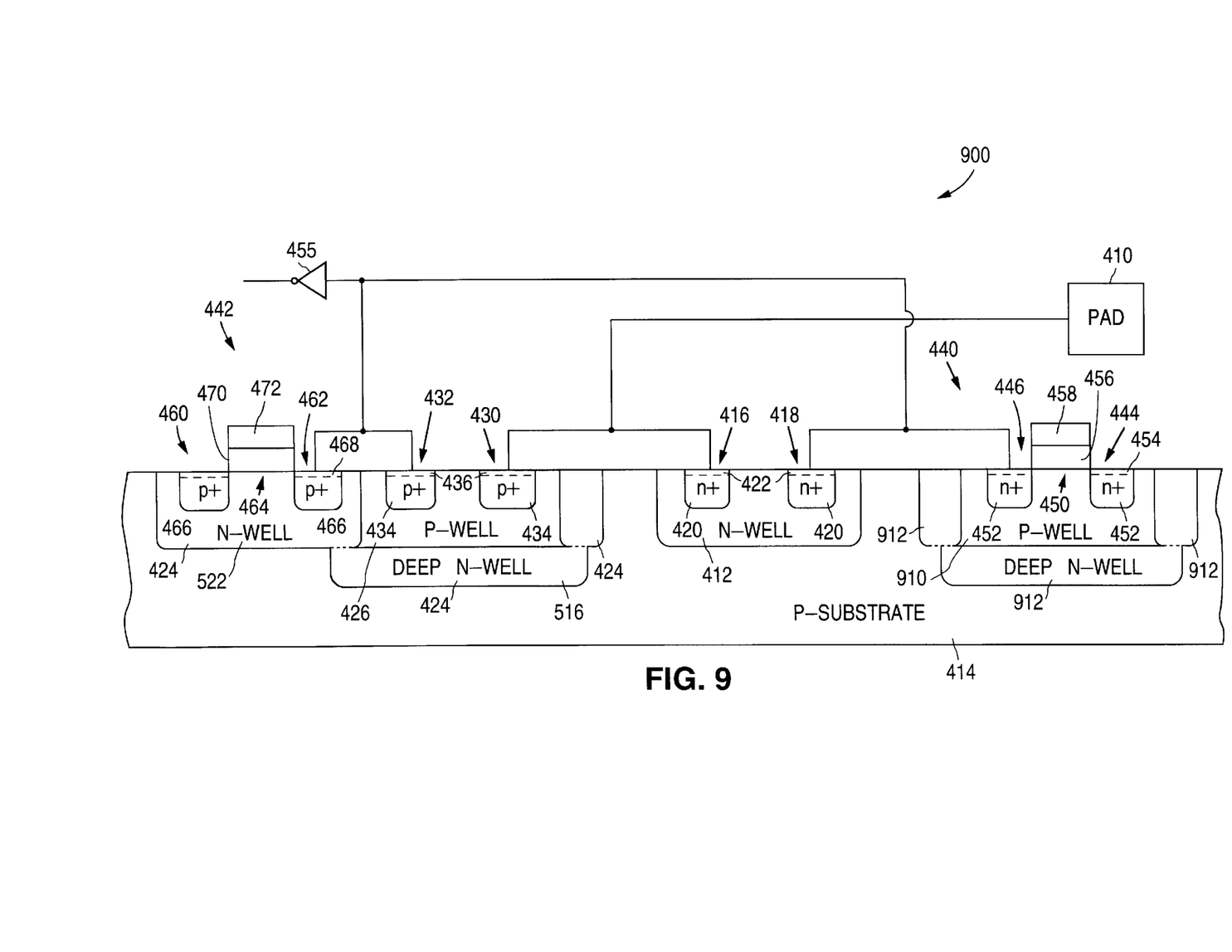
FIG. 9 is a schematic and cross-sectional view illustrating an I/O circuit 900 in accordance with a second alternate embodiment of the present invention.

FIG. 9 shows a schematic and cross-sectional view of an I/O circuit 900 in accordance with a second alternate embodiment of the present invention. Circuit 900 is similar to circuit 400 and, as a result, utilizes the same reference numerals to designate the structures that are common to both circuits.

As shown in FIG. 9, circuit 900 differs from circuit 400 in that driver transistor 440 of I/O circuit 900 is formed in a p− well 910 which is formed in a n− well 912 which, in turn, is formed in material 414.

The advantage of utilizing wells 910 and 912 is that driver transistor 440, which tends to be noisy, can be isolated from the core circuitry by applying a first ground to p− well 910, an I/O supply voltage to n− well 912, and a second ground, which is not connected to the first ground, to material 414. By isolating driver transistor 440, I/O noise may be kept off of the second ground which is used by the internal circuitry.

In addition, driver transistor 442 is also isolated from the core circuitry by applying the I/O supply voltage to n− well 424. By utilizing the I/O supply voltage to bias n− well 424, I/O noise may also be kept off of the positive supply voltage VCC.

Another advantage of circuit 900 is that circuit 900 can be formed with the same steps that are required to form circuit 400. N− well 912 is formed during the same steps that are used to form wells 516 and 522, while p− well 910 is formed during the same steps that are used to form p− well 528.

It should be understood that various alternatives to the embodiment of the invention described herein may be employed in practicing the invention. For example, if a n− substrate is used, the opposite conductivity types for each of the wells and diffusion regions are used. Thus, it is intended that the following claims define the scope of the invention and that methods and structures within the scope of these claims and their equivalents be covered thereby.

What is claimed is:

1. An input/output circuit formed in a semiconductor material of a first conductivity type, the circuit comprising:
   a first well of a second conductivity type formed in the semiconductor material;
   a second well of the first conductivity type formed in the first well, the second well having a dopant concentration;
   a pair of spaced-apart first contacts of the first conductivity type formed in the second well, the first contacts having a dopant concentration that is greater than the dopant concentration of the second well;
   a third well of the second conductivity type formed in the semiconductor material, the third well having a dopant concentration, and a bottom surface;
   a pair of spaced-apart second contacts of the second conductivity type formed in the third well, the second contacts having a dopant concentration that is greater than the dopant concentration of the third well;
   an I/O pad connected to a first contact of the first contacts in the second well, and a first contact of the second contacts in the third well;
   a first driver transistor connected to a second contact of the first contacts in the second well;
   a second driver transistor connected to a second contact of the second contacts in the third well; and
   an internal circuit connected to the second contact of the first contacts, and the second contact of the second contacts.

2. The I/O circuit of claim 1 wherein the first driver transistor includes:
   spaced-apart source and drain regions formed in the first well;
   a channel defined between the source and drain regions; and
   a gate insulatively disposed over the channel.

3. The I/O circuit of claim 1 wherein the second driver transistor includes:
   spaced-apart source and drain regions formed in the semiconductor material;
   a channel defined between the source and drain regions; and
   a gate insulatively disposed over the channel.

4. The I/O circuit of claim 1 wherein the first well includes:
   a buried well formed in the semiconductor material having a top surface and a bottom surface, the bottom surface of the buried well being lower than the bottom surface of the third well; and
   a top well formed in the semiconductor material, the top well having a bottom surface that contacts the top surface of the buried well.

5. The method of claim 4 wherein the second well is isolated from the semiconductor material by the buried and top wells.

6. An input/output circuit formed in a semiconductor material of a. first conductivity type, the circuit comprising:
   a first well of a second conductivity type formed in the semiconductor material;
   a second well of the first conductivity type formed in the first well, the second well having a dopant concentration;
   a pair of spaced-apart first contacts of the first conductivity type formed in the second well, the first contacts having a dopant concentration that is greater than the dopant concentration of the second well;
   a third well of the second conductivity type formed in the semiconductor material, the third well having a dopant concentration, and a bottom surface;
   a pair of spaced-apart second contacts of the second conductivity type formed in the third well, the second contacts having a dopant concentration that is greater than the dopant concentration of the third well;
   a fourth well of a second conductivity type formed in the semiconductor material;

a fifth well of the first conductivity type formed in the fourth well, the fifth well having a dopant concentration;

an I/O pad connected to a first contact of the first contacts in the second well, and a first contact of the second contacts in the third well;

a first driver transistor connected to a second contact of the first contacts in the second well;

a second driver transistor connected to a second contact of the second contacts in the third well; and an internal circuit connected to the second contact of the first contacts, and the second contact of the second contacts.

7. The I/O circuit of claim 6 wherein the first driver transistor includes:

spaced-apart source and drain regions formed in the first well;

a channel defined between the source and drain regions; and a gate insulatively disposed over the channel.

8. The I/O circuit of claim 6 wherein the second driver transistor includes:

spaced-apart source and drain regions formed in the semiconductor material;

a channel defined between the source and drain regions; and a gate insulatively disposed over the channel.

9. The I/O circuit of claim 6 wherein the first well includes:

a buried well formed in the semiconductor material having a top surface and a bottom surface, the bottom surface of the buried well being lower than the bottom surface of the third well; and a top well formed in the semiconductor material, the top well having a bottom surface that contacts the top surface of the buried well.

10. The I/O circuit of claim 6 wherein the second well is isolated from the semiconductor material by the buried and top wells.

11. The I/O circuit of claim 1 and further comprising:

a first diode connected to a supply rail and the I/O pad; and a second diode connected to the I/O pad and ground.

12. A method for forming an input/output circuit in a semiconductor material of a first conductivity type, the method comprising the steps of:

forming a first well of a second conductivity type in the semiconductor material;

forming a second well of the first conductivity type in the first well, the second well having a dopant concentration;

forming a pair of spaced-apart first contacts of the first conductivity type in the second well, the first contacts having a dopant concentration that is greater than the dopant concentration of the second well;

forming a third well of the second conductivity type in the semiconductor material, the third well having a dopant concentration, and a bottom surface;

forming a pair of spaced-apart second contacts of the second conductivity type in the third well, the second contacts having a dopant concentration that is greater than the dopant concentration of the third well;

forming an I/O pad connected to a first contact of the first contacts in the second well, and a first contact of the second contacts in the third well;

forming a first driver transistor connected to a second contact of the first contacts in the second well;

forming a second driver transistor connected to a second contact of the second contacts in the third well; and forming an internal circuit connected to the second contact of the first contacts, and the second contact of the second contacts.

13. The method of claim 12 wherein the step of forming the first well includes:

forming a buried well in the semiconductor material, the buried well having a top surface and a bottom surface, the bottom surface of the buried well being lower than the bottom surface of the third well; and forming a top well in the semiconductor material, the top well having a bottom surface that contacts the top surface of the buried well.

14. The method of claim 12 wherein the second well is isolated from the semiconductor material by the buried and top wells.

* * * * *

UNITED STATES PATENT AND TRADEMARK OFFICE
CERTIFICATE OF CORRECTION

PATENT NO. : 6,184,557 B1
DATED : February 6, 2001
INVENTOR(S) : Pavel Poplevine et al.

Page 1 of 1

It is certified that error appears in the above-identified patent and that said Letters Patent is hereby corrected as shown below:

<u>Column 8,</u>
Line 48, delete "a." and replace with -- a --.

Signed and Sealed this

Fourteenth Day of August, 2001

*Attest:*

*Attesting Officer*

NICHOLAS P. GODICI
*Acting Director of the United States Patent and Trademark Office*